(12) United States Patent
Luan

(10) Patent No.: US 10,126,462 B2
(45) Date of Patent: *Nov. 13, 2018

(54) PROXIMITY SENSOR, ELECTRONIC APPARATUS AND METHOD FOR MANUFACTURING PROXIMITY SENSOR

(71) Applicant: STMICROELECTRONICS PTE LTD, Singapore (SG)

(72) Inventor: Jing-En Luan, Shenzhen (CN)

(73) Assignee: STMICROELECTRONICS PTE LTD, Singapore (SG)

( * ) Notice: Subject to any disclaimer, the term of this patent is extended or adjusted under 35 U.S.C. 154(b) by 365 days.

This patent is subject to a terminal disclaimer.

(21) Appl. No.: 14/982,518

(22) Filed: Dec. 29, 2015

(65) Prior Publication Data

US 2017/0123101 A1    May 4, 2017

(30) Foreign Application Priority Data

Nov. 2, 2015   (CN) .......................... 2015 1 0732182

(51) Int. Cl.
*G01V 8/12* (2006.01)
*G01V 13/00* (2006.01)

(52) U.S. Cl.
CPC ...................... *G01V 8/12* (2013.01)

(58) Field of Classification Search
CPC .......... G01V 8/12; G01V 8/10; G01S 17/026; H03K 17/945; H03K 17/941; H03K 2017/9455; H01L 25/167; H01L 2924/181
See application file for complete search history.

(56) References Cited

U.S. PATENT DOCUMENTS

| | | | |
|---|---|---|---|
| 9,645,238 B1* | 5/2017 | Luan | G01S 17/026 |
| 9,768,341 B2* | 9/2017 | Luan | H01L 31/173 |
| 2004/0238726 A1 | 12/2004 | Caldwell | |
| 2006/0016970 A1* | 1/2006 | Nagasaka | G01D 5/305 |
| | | | 250/231.13 |
| 2006/0079018 A1* | 4/2006 | Hurt | G02B 6/4206 |
| | | | 438/64 |
| 2007/0018123 A1 | 1/2007 | Sano | |
| 2007/0210267 A1 | 9/2007 | Ishii et al. | |
| 2008/0006762 A1 | 1/2008 | Fadell et al. | |
| 2010/0044722 A1* | 2/2010 | Lai | H01L 27/14618 |
| | | | 257/80 |

(Continued)

FOREIGN PATENT DOCUMENTS

| | | |
|---|---|---|
| CN | 102096464 A | 6/2011 |
| CN | 104272474 A | 1/2015 |
| CN | 104332524 A | 2/2015 |

*Primary Examiner* — John Lee
(74) *Attorney, Agent, or Firm* — Seed Intellectual Property Law Group LLP

(57) ABSTRACT

The embodiments of the present disclosure provide a proximity sensor, an electronic apparatus and a method for manufacturing a proximity sensor. The proximity sensor comprises a sensor chip, a light-emitting device, a transparent molding material and a non-transparent molding material, wherein the sensor chip comprises a sensor region; the light-emitting device is located on the sensor chip and is electrically coupled to the sensor chip; the transparent molding material at least covers a light-emitting surface of the light-emitting device; and the non-transparent molding material isolates the transparent molding material from the sensor region.

26 Claims, 15 Drawing Sheets

(56) References Cited

U.S. PATENT DOCUMENTS

| | | | |
|---|---|---|---|
| 2011/0141486 A1 | 6/2011 | Wada et al. | |
| 2012/0132793 A1* | 5/2012 | Campbell | H01L 27/14618 250/221 |
| 2012/0248625 A1* | 10/2012 | Coffy | G01S 7/4813 257/774 |
| 2013/0153772 A1 | 6/2013 | Rossi et al. | |
| 2013/0248887 A1* | 9/2013 | Coffy | G01S 7/481 257/81 |
| 2013/0292553 A1 | 11/2013 | Chang et al. | |
| 2014/0091326 A1* | 4/2014 | Tran | H01L 27/14 257/81 |
| 2014/0374776 A1 | 12/2014 | Nakasuji et al. | |
| 2015/0137148 A1* | 5/2015 | Wong | H01L 25/167 257/82 |
| 2016/0025855 A1 | 1/2016 | Camarri et al. | |
| 2016/0043054 A1* | 2/2016 | Fischer | H01L 25/0655 438/107 |
| 2016/0141440 A1* | 5/2016 | Chun | H01L 31/12 257/82 |
| 2016/0187483 A1* | 6/2016 | Luan | G01S 17/026 250/221 |
| 2016/0190380 A1* | 6/2016 | Luan | H01L 31/16 257/82 |
| 2017/0052040 A1 | 2/2017 | Luan | |
| 2017/0123064 A1* | 5/2017 | Luan | G01S 17/026 |
| 2017/0123101 A1* | 5/2017 | Luan | G01V 8/12 |

\* cited by examiner

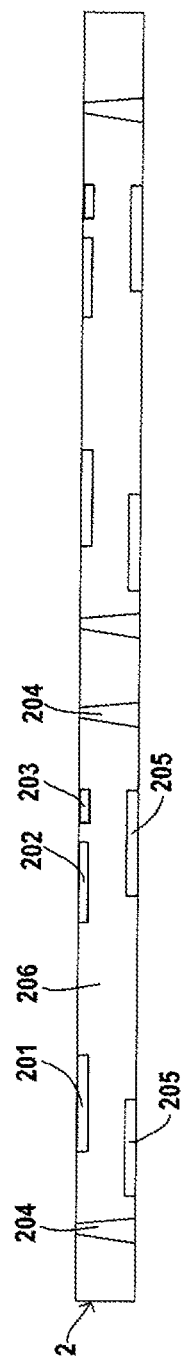
Fig. 3A
Fig. 3B

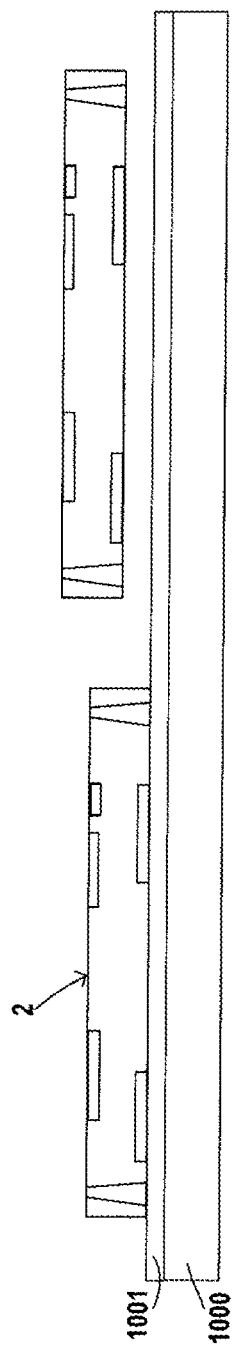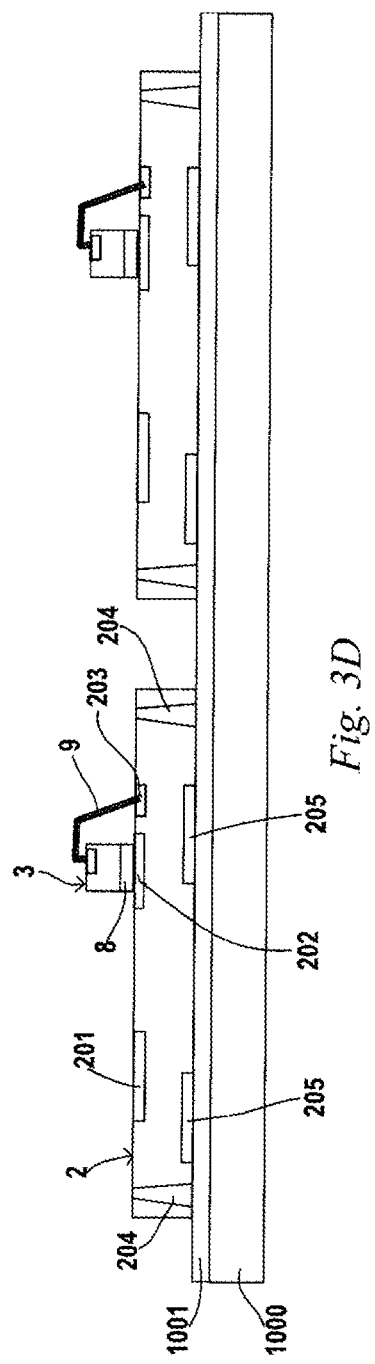

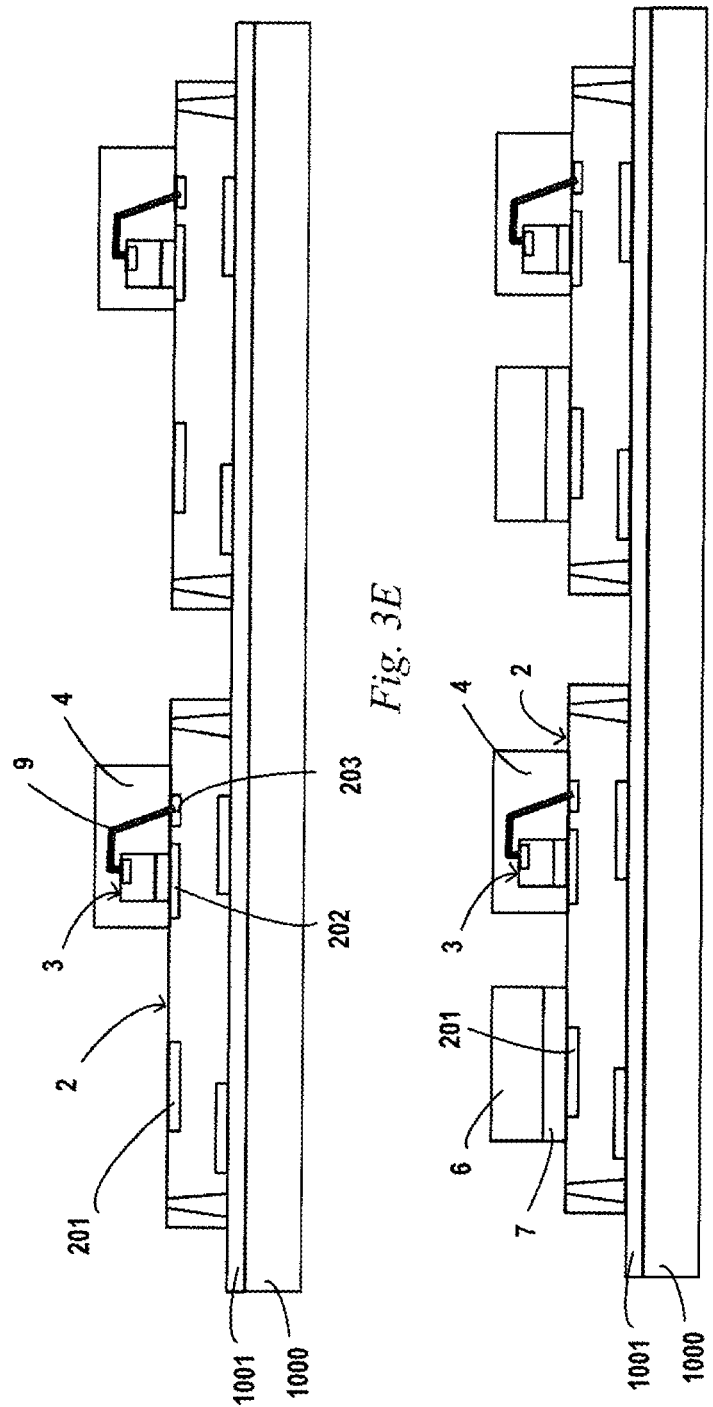

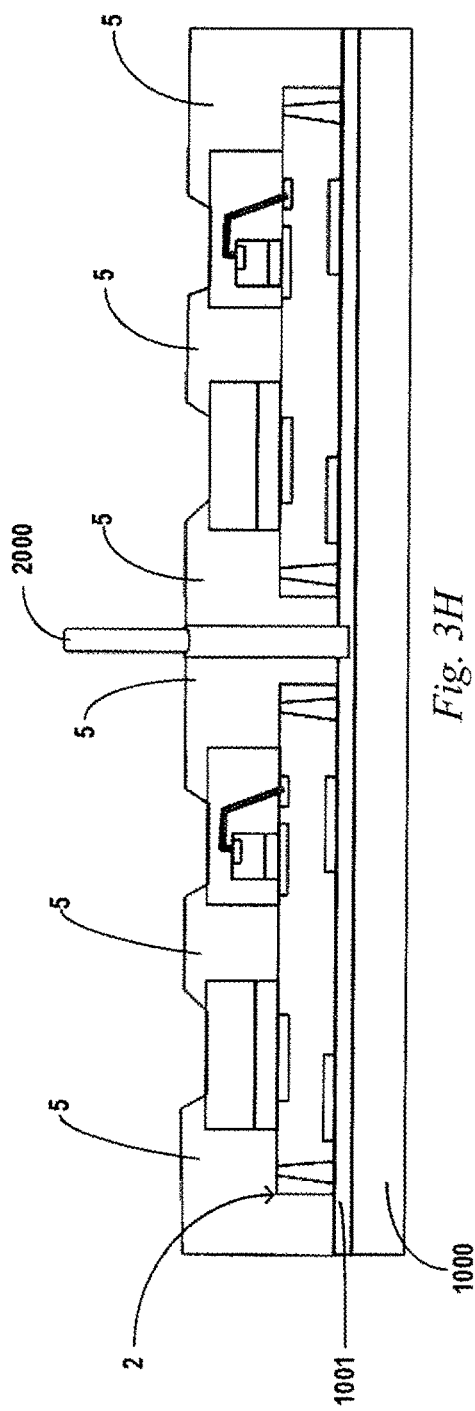
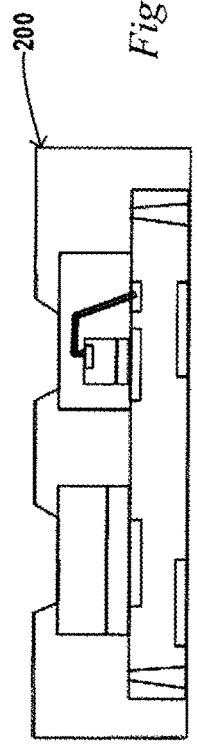
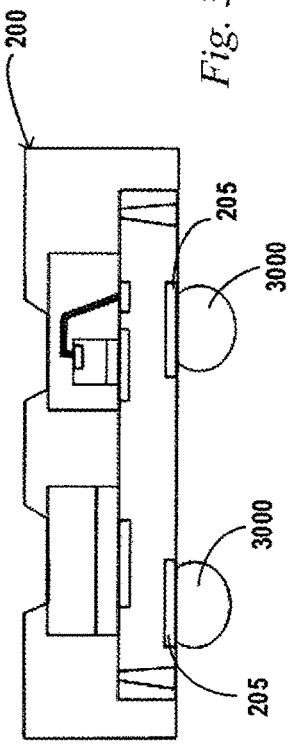
Fig. 3H
Fig. 3I
Fig. 3J

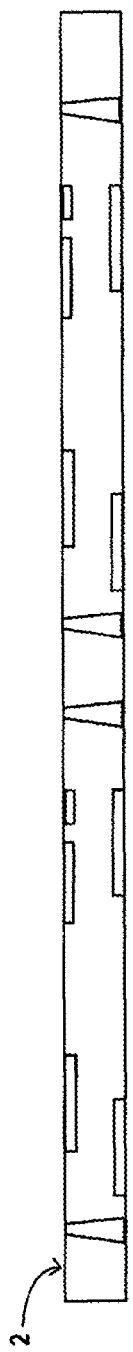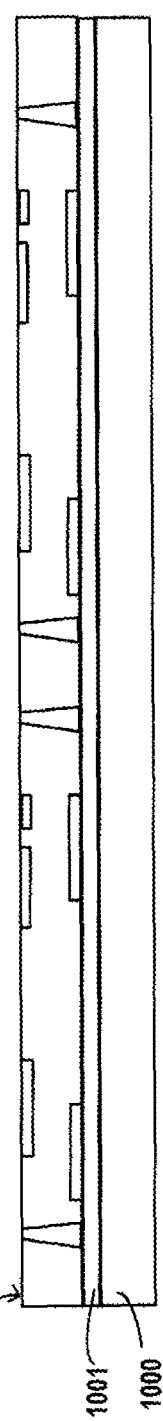
Fig. 5A
Fig. 5B
Fig. 5C

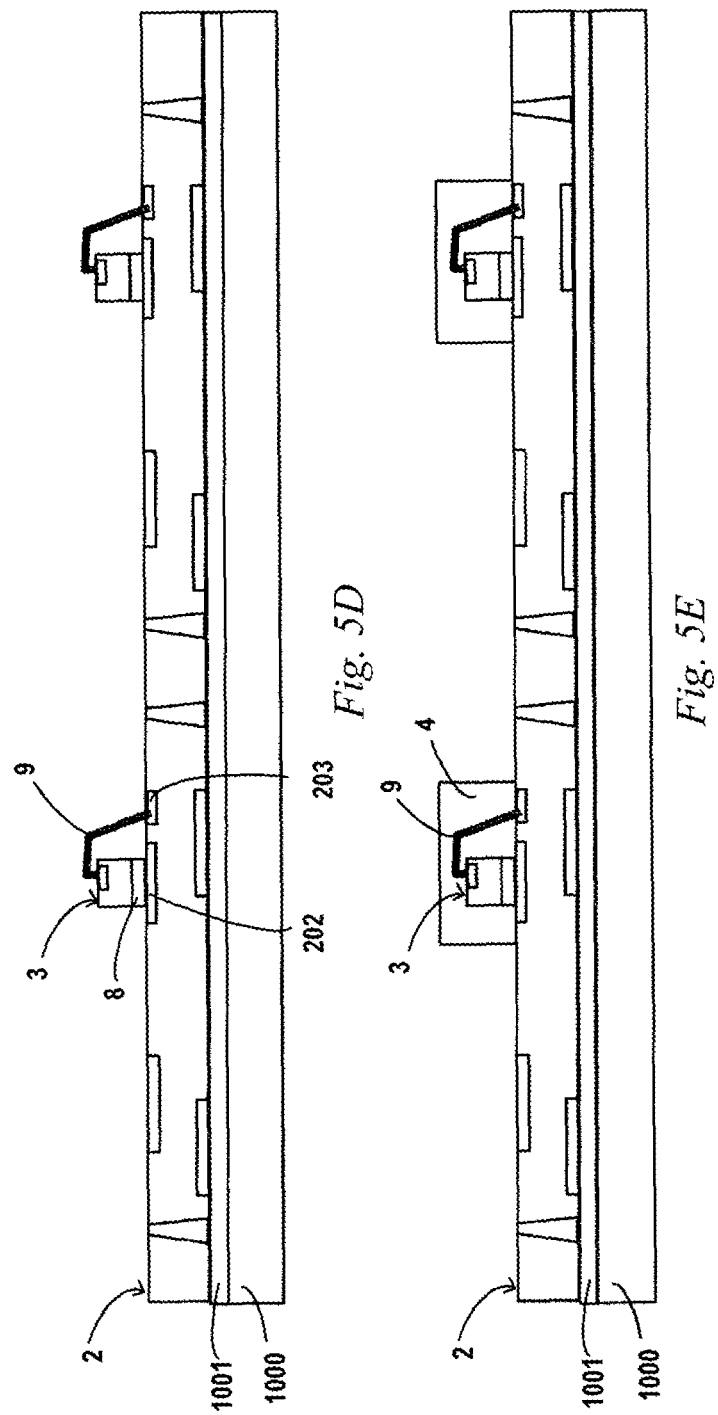

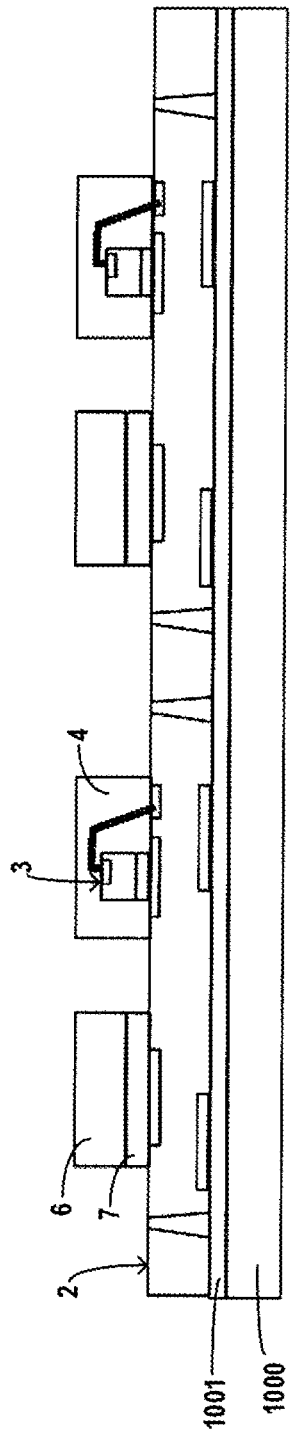
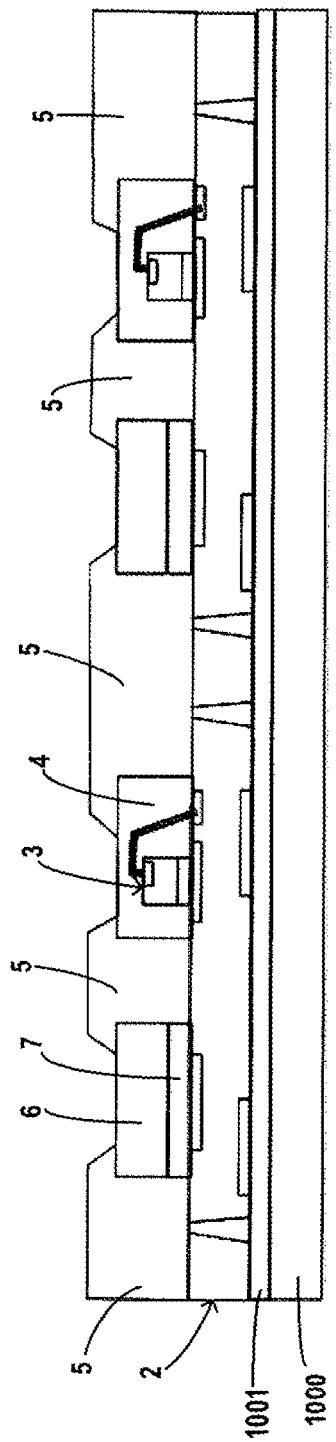
Fig. 5F
Fig. 5G

PROXIMITY SENSOR, ELECTRONIC APPARATUS AND METHOD FOR MANUFACTURING PROXIMITY SENSOR

BACKGROUND

Technical Field

The embodiments of the present disclosure relate to the field of image sensor apparatuses, and more particularly, to a proximity sensor, an electronic apparatus and a method for manufacturing a proximity sensor.

Description of the Related Art

In general, an electronic apparatus may contain one or more image sensor modules for providing enhanced media functions. For example, a typical electronic apparatus can utilize the image sensor modules for image capturing or video teleconferencing. Some electronic apparatuses comprise additional image sensor apparatuses for other purposes, such as a proximity sensor.

For example, the electronic apparatus can use the proximity sensor to provide object distances for providing focusing adjustment to a camera-specific image sensor module. In mobile apparatus applications, the proximity sensor can be used for detection when a user's hand is nearby, thereby quickly and accurately waking up the apparatus from a power saving sleep mode. In general, the proximity sensor comprises a light-emitting device directing radiation to a potential nearby object, and a sensor chip receiving the radiation reflected by the nearby object.

FIG. 1 shows a cross-section diagram of a proximity sensor 100 in the prior art. As shown in FIG. 1, the proximity sensor 100 comprises a substrate 1, a sensor chip 2 and a light-emitting device 3 on the substrate 1, and a cap 11 coupled to the substrate 1 and the sensor chip 2 by means of an adhesive 110 and having openings therein. The substrate 1 comprises a dielectric layer 101, a plurality of conductive traces 102 between the dielectric layer 101, and first conductive contacts 103 and second conductive contacts 104 which are supported by the dielectric layer 101 and coupled to the conductive traces 102, wherein the first conductive contacts 103 are provided at an upper surface of the substrate 1 and the second conductive contacts 104 are provided at a lower surface of the substrate 1. The sensor chip 2 is attached to the upper surface of the substrate 1 by means of an adhesive 10. The light-emitting device 3 is attached to the upper surface of the substrate 1 by means of a conductive attachment material 8. The sensor chip 2 and the light-emitting device 3 are electrically coupled to the first conductive contacts 103 of the substrate 1 respectively by means of corresponding conductive wires 9, such as solder wires. The proximity sensor 100 further comprises filtering components 61 and 62 which are respectively adhered to the cap 11 by means of adhesives 60 so as to cover corresponding openings. The filtering component 61 is provided right above a sensor region 201 of the sensor chip 2. The filtering component 62 is provided right above the light-emitting device 3.

In the proximity sensor 100 shown in FIG. 1, since the price of the cap 11 is high, the manufacturing cost of the entire proximity sensor 100 is high. In addition, when such a proximity sensor 100 is manufactured, a cap 11 is installed for each individual proximity sensor 100, which makes the manufacturing process take a longer time, thereby reducing the productivity.

BRIEF SUMMARY

One or more embodiments of the embodiments of the present disclosure provide a new type of proximity sensor and a method for manufacturing, such a proximity sensor that may reduce the manufacturing cost and/or improve the productivity.

According to a first aspect of the present disclosure, a proximity sensor is provided, comprising: a sensor chip comprising a sensor region; a light-emitting device located on the sensor chip and electrically coupled to the sensor chip; a transparent molding material at least covering a light-emitting surface of the light-emitting device; and a non-transparent molding material isolating the transparent molding material from the sensor region.

According to an exemplary embodiment of the present disclosure, the light-emitting device is sealed by the transparent molding material.

According to an exemplary embodiment of the present disclosure, the light-emitting device is attached to the sensor chip by means of a conductive attachment material.

According to an exemplary embodiment of the present disclosure, the proximity sensor further comprises: a filtering component located right above the sensor region.

According to an exemplary embodiment of the present disclosure, the filtering component is adhered to the sensor chip by means of a transparent adhesive.

According to an exemplary embodiment of the present disclosure, the non-transparent molding material partially covers a surface of the sensor chip which has the sensor region, such that the sensor region is not covered by the non-transparent molding material.

According to an exemplary embodiment of the present disclosure, the non-transparent molding material partially covers the transparent molding material, such that a light emergent path of the light-emitting device is not covered by the non-transparent molding material.

According to an exemplary embodiment of the present disclosure, the sensor chip comprises by through-silicon vias.

According to a second aspect of the present disclosure, another proximity sensor is provided, comprising: a sensor chip comprising a sensor region; a light-emitting assembly located on the sensor chip, the light-emitting assembly comprising a substrate, a light-emitting device located on the substrate and electrically coupled to the substrate, and a transparent molding material at least covering a light-emitting surface of the light-emitting device, wherein the substrate is electrically coupled to the sensor chip; and a non-transparent molding material isolating the light-emitting assembly from the sensor region.

According to a third aspect of the present disclosure, an electronic apparatus is provided comprising any of the proximity sensors as described above.

According to a fourth aspect of the present disclosure, a method for manufacturing a proximity sensor is provided, comprising: providing a sensor chip, the sensor chip comprising a sensor region; providing a light-emitting device on the sensor chip, and electrically coupling the light-emitting device to the sensor chip; at least covering a light-emitting surface of the light-emitting device using a transparent molding material; and isolating the transparent molding material from the sensor region using a non-transparent molding material.

According to an exemplary embodiment of the present disclosure, the step of providing a sensor chip comprises providing the sensor chip on a carrier; and the method further comprises: after isolating the transparent molding material from the sensor region using a non-transparent molding material, removing the carrier.

According to an exemplary embodiment of the present disclosure, at least covering a light-emitting surface of the light-emitting device using a transparent molding material comprises: sealing the light-emitting device using the transparent molding material.

According to an exemplary embodiment of the present disclosure, electrically coupling the light-emitting device to the sensor chip comprises: attaching the light-emitting device to the sensor chip by means of a conductive attachment material.

According to an exemplary embodiment of the present disclosure, the method further comprises: after at least covering a light-emitting surface of the light-emitting device using a transparent molding material, and before isolating the transparent molding material from the sensor region using a non-transparent molding material, providing a filtering component right above the sensor region.

According to an exemplary embodiment of the present disclosure, providing a filtering component right above the sensor region comprises: adhering the filtering component to the sensor chip by means of a transparent adhesive.

According to an exemplary embodiment of the present disclosure, isolating the transparent molding material from the sensor region using a non-transparent molding material further comprises: partially covering a surface of the sensor chip which has the sensor region using the non-transparent molding material, such that the sensor region is not covered by the non-transparent molding material.

According to an exemplary embodiment of the present disclosure, isolating the transparent molding material from the sensor region using a non-transparent molding material further comprises: partially covering the transparent molding material using the non-transparent molding material, such that a light emergent path of the light-emitting device is not covered by the non-transparent molding material.

According to an exemplary embodiment of the present disclosure, the sensor chip comprises through-silicon vias.

According to an exemplary embodiment of the present disclosure, the method further comprises: after isolating the transparent molding material from the sensor region using a non-transparent molding material, performing singulation processing.

According to a fifth aspect of the present disclosure, a method for manufacturing a proximity sensor is provided, comprising: providing a sensor chip, the sensor chip comprising a sensor region; providing a light-emitting assembly on the sensor chip, the light-emitting assembly comprising a substrate, a light-emitting device located on the substrate and electrically coupled to the substrate, and a transparent molding material at least covering a light-emitting surface of the light-emitting device; and isolating the light-emitting assembly from the sensor region using a non-transparent molding material.

In the various embodiments of the present disclosure, by providing a light-emitting device on a sensor chip and adopting a molding material to isolate the light-emitting device from a sensor region, the use of a cap is avoided, which is capable of reducing the manufacturing cost of the proximity sensor and is capable of improving the productivity. In addition, since no substrate is utilized to support the sensor chip, it is possible to reduce the overall size of the proximity sensor.

BRIEF DESCRIPTION OF THE SEVERAL VIEWS OF THE DRAWINGS

When reading the detailed description of the exemplary embodiments below in conjunction with the accompanying drawings, these and other objectives, features and advantages will become apparent, in which:

FIGS. 3A-3J are cross-section diagrams showing a flow for manufacturing the proximity sensor shown in FIG. 2;

FIGS. 5A-5I are cross-section diagrams showing a flow for manufacturing the proximity sensor shown in FIG. 4;

DETAILED DESCRIPTION

The principles and method of the present disclosure will be described below with reference to several exemplary embodiments in the accompanying drawings. It should be understood that the description of these embodiments is merely to enable those skilled in the art to better understand and thus to implement the present disclosure, rather than limiting the scope of the present disclosure by any means.

Figure 2:
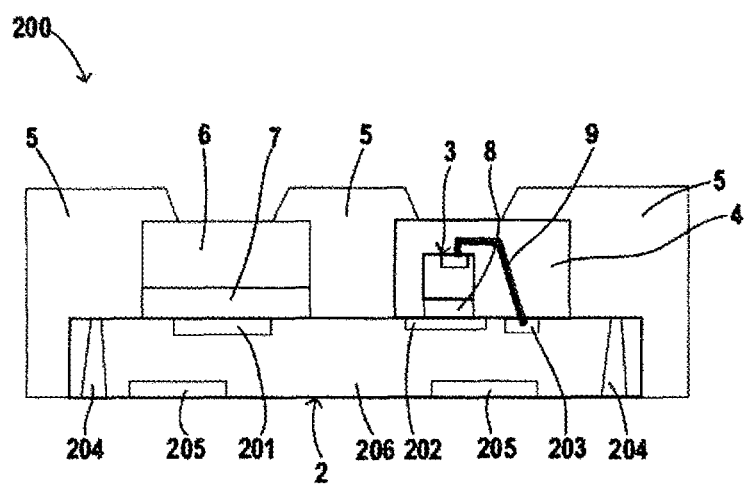
FIG. 2 shows a cross-section diagram of a proximity sensor according to an exemplary embodiment of the present disclosure.

FIG. 2 shows a cross-section diagram of a proximity sensor 200 according to an exemplary embodiment of the present disclosure. As shown in FIG. 2, the proximity sensor 200 may comprise a sensor chip 2, a light-emitting device 3, a transparent molding material 4 and a non-transparent molding material 5. The sensor chip 2 comprises a sensor region 201. The light-emitting device 3 is located on the sensor chip 2 and electrically coupled to the sensor chip 2. The transparent molding material 4 at least covers a light-emitting surface of the light-emitting device 3. The transparent molding material 4 and the sensor region 201 are isolated by the non-transparent molding material 5.

A main body 206 of the sensor chip 2 may be made from a semiconductor material (e.g., silicon). As shown in FIG. 2, the sensor chip 2 may comprise an attachment region 202 for the attachment of the light-emitting device 3. The sensor region 201 and the attachment region 202 are provided on an upper surface of the sensor chip 2 at an interval. The sensor region 201 is used for receiving radiation reflected by a nearby object. The sensor chip 2 may further comprise a first conductive contact 203 and second conductive contacts 205. The first conductive contact 203 is provided at the upper surface of the sensor chip 2 for electrical coupling to the light-emitting device 3. The second conductive contacts 205 are provided at a lower surface of the sensor chip 2 for electrical coupling to other circuits. The sensor chip 2 may further comprise through-silicon vias (TSVs) 204 extending from the upper surface thereof to the lower surface thereof so as to provide electrical coupling from the upper surface of the sensor chip 2 to the lower surface.

The light-emitting device 3 may comprise a vertical cavity surface emitting laser (VCSEL) or a light-emitting diode (LED), e.g., an infrared LED. As shown in FIG. 2, the light-emitting device 3 can be attached to the upper surface of the sensor chip 2 by means of a conductive attachment material 8. In particular, the light-emitting device 3 can be attached to the attachment region 202 on the upper surface of the sensor chip 2 by means of the conductive attachment material 8. In addition, the light-emitting device 3 can also be electrically coupled to the conductive contact 203 at the upper surface of the sensor chip 2 via a solder wire 9. In the various embodiments, different light-emitting devices 3 can be electrically coupled to the sensor chip 2 in different ways, for example, via the conductive attachment material 8, via the conductive wire 9 or via a combination of the two. In addition, the light-emitting device 3 is not limited to the types mentioned above, but may comprise various types of light sources which can be used in the proximity sensor 200.

The transparent molding material 4 may be various types of transparent polymer materials. The transparent molding material 4 can be at least formed on a light-emitting surface (e.g., the upper surface shown in FIG. 2) of the light-emitting device 3 by means of a molding process. As an example, the light-emitting device 3 can be sealed by the transparent molding material 4. As shown in FIG. 2, the transparent molding material 4 completely wraps the light-emitting device 3 and the conductive wire 9 for electrically coupling the light-emitting device 3 to the sensor chip 2. Those skilled in the art will appreciate that the transparent molding material 4 need not completely cover the light-emitting device 3, but only needs to cover the light-emitting surface of the light-emitting device 3.

As shown in FIG. 2, the proximity sensor 200 may further comprise a filtering component 6 located right above the sensor region 201. The filtering component 6 can be adhered to the sensor chip 2 by means of a transparent adhesive 7. The filtering component 6 may, for example, be a light filter, so as to selectively pass light having a specific wavelength (e.g., infrared light) therethrough. For example, the filtering component 6 may be glass, at least one surface of which is coated with a material layer selectively passing light having a specific wavelength through.

As shown in FIG. 2, replacing the cap 11 in the prior art, the non-transparent molding material 5 is adopted to isolate the transparent molding material 4 from the sensor region 201. As a result, the non-transparent molding material 5 isolates the light-emitting surface of the light-emitting device 3 from the sensor region 201 so as to prevent light radiated by the light-emitting device 3 from directly arriving at the sensor region 201 without being reflected by a nearby object.

The non-transparent molding material 5 partially covers the surface of the sensor chip 2 which has the sensor region 201 (i.e., the upper surface thereof), such that the sensor region 201 is not covered by the non-transparent molding material 5. In addition, the non-transparent molding material 5 also covers the side surfaces of the sensor chip 2. When the filtering component 6 is provided above the sensor region 201, the non-transparent molding material 5 can also cover a portion of the filtering component 6, such that a portion of the filtering component 6 which is located right above the sensor region 201 is not covered by the non-transparent molding material 5, in order that light reflected by the nearby object can arrive at the sensor region 201.

The non-transparent molding material 5 partially covers the transparent molding material 4, such that a light emergent path of the light-emitting device 3 is not covered by the non-transparent molding material 5. In particular, a portion of the transparent molding material 4 which is located right above the light-emitting surface of the light-emitting device 3 is not covered by the non-transparent molding material 5, in order that light emitted from the light-emitting device 3 can shine out.

In the proximity sensor 200 shown in FIG. 2, the light radiated by the light-emitting device 3 can be emitted out via the transparent molding material 4 so as to arrive at a nearby object and to be reflected by the nearby object. Afterwards, the light reflected by the nearby object can pass through the filtering component 6 provided above the sensor region 201 and the transparent adhesive 7 to arrive at the sensor region 201.

Figure 1:
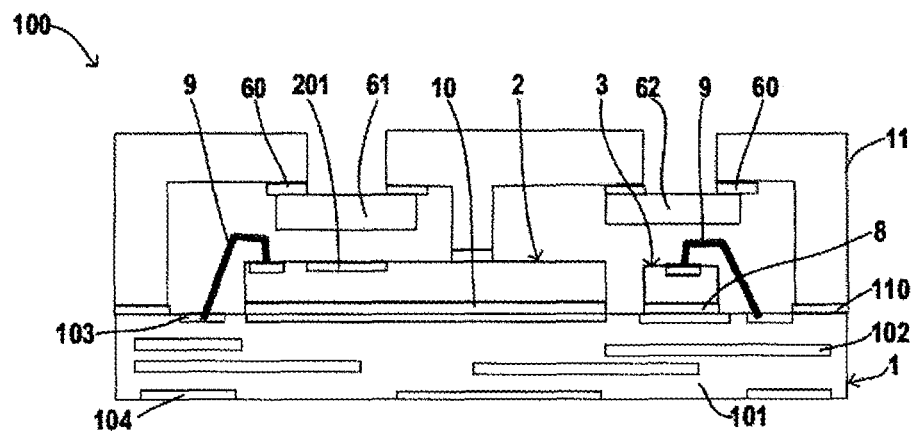
FIG. 1 shows a cross-section diagram of a proximity sensor in the prior art.

By providing the light-emitting device 3 on the sensor chip 2 and adopting the non-transparent molding material 5 to isolate the light-emitting device 3 from the sensor region 201, as compared to the proximity sensor 100 shown in FIG. 1, the use of the cap 11 is avoided, which is capable of reducing the manufacturing cost of the proximity sensor 200 and is capable of improving the productivity. In addition, as compared to the proximity sensor 100 shown in FIG. 1, since a substrate 1 is not used to support the sensor chip 2, it is possible to reduce the overall size of the proximity sensor 200.

FIGS. 3A-3J are cross-section diagrams showing a process flow for manufacturing the proximity sensor 200 shown in FIG. 2. The manufacturing process for the proximity sensor 200 will be described in detail below in conjunction with FIGS. 3A-3J.

As shown in FIG. 3A, a sensor wafer is provided, wherein the sensor wafer comprises a plurality of sensor chips 2. In FIG. 3A, only two sensor chips 2 are shown as an example. A main body 206 of the sensor chip 2 may be made from a semiconductor material (e.g., silicon). The sensor chip 2 comprises a sensor region 201 and an attachment region 202 for the attachment of a light-emitting device 3. The sensor region 201 and the attachment region 202 are provided on an upper surface of the sensor chip 2 at an interval. The sensor region 201 is used for receiving radiation reflected by a nearby object. The sensor chip 2 may further comprise a first conductive contact 203 and second conductive contacts 205. The first conductive contact 203 is provided at the upper surface of the sensor chip 2 for electrical coupling to the light-emitting device 3 in a subsequent step. The second conductive contacts 205 are provided at a lower surface of the sensor chip 2 for electrical coupling to other circuits. The sensor chip 2 may further comprise through-silicon vias (TSVs) 204 extending from the upper surface thereof to the lower surface thereof so as to provide electrical coupling from the upper surface of the sensor chip 2 to the lower surface.

As shown in FIG. 3B, a carrier 1000 is provided, wherein an adhesive 1001 for fixing the sensor chip 2 is provided on an upper surface of the carrier 1000.

As shown in FIG. 3C, individual sensor chips 2 are fixed on the carrier 1000 by means of the adhesive 1001.

As shown in FIG. 3D, light-emitting devices 3 are respectively provided on the various sensor chips 2, and the light-emitting devices 3 are electrically coupled to the corresponding sensor chips 2. The light-emitting device 3 may comprise a vertical cavity surface emitting laser (VCSEL) or a light-emitting diode (LED), e.g., an infrared LED. The light-emitting device 3 can be attached to the upper surface of the sensor chip 2 by means of a conductive attachment material 8. In particular, the light-emitting device 3 can be attached to the attachment region 202 on the upper surface of the sensor chip 2 by means of the conductive attachment material 8. In addition, the light-emitting device 3 can also be electrically coupled to the conductive contact 203 at the upper surface of the sensor chip 2 via a conductive wire 9. In the various embodiments, different light-emitting devices 3 can be electrically coupled to the sensor chip 2 in different ways, for example, via the conductive attachment material 8, via the conductive wire 9 or via a combination of the two. In addition, the light-emitting device 3 is not limited to the types mentioned above, but may comprise various types of light sources which can be used in the proximity sensor 200.

As shown in FIG. 3E, the transparent molding material 4 is used to at least cover a light-emitting surface of the light-emitting device 3. The transparent molding material 4 may be various types of transparent polymer materials. The transparent molding material 4 can be at least formed on the light-emitting surface (e.g., the upper surface shown in FIG. 3E) of the light-emitting device 3 by means of a molding process. As an example, the light-emitting device 3 can be sealed by the transparent molding material 4. As shown in FIG. 3E, the transparent molding material 4 completely wraps the light-emitting device 3 and the conductive wire 9 for electrically coupling the light-emitting device 3 to the sensor chip 2. Those skilled in the art will appreciate that the transparent molding material 4 need not completely cover the light-emitting device 3, but may only cover the light-emitting surface of the light-emitting device 3.

As shown in FIG. 3F, a filtering component 6 is provided right above the sensor region 201. For example, the filtering component 6 can be adhered to the sensor chip 2 by means of a transparent adhesive 7. The filtering component 6 may, for example, be a light filter, so as to selectively pass light having a specific wavelength (e.g., infrared light) therethrough. For example, the filtering component 6 may be glass, at least one surface of which is coated with a material layer selectively passing light having a specific wavelength through.

Figure 3G:
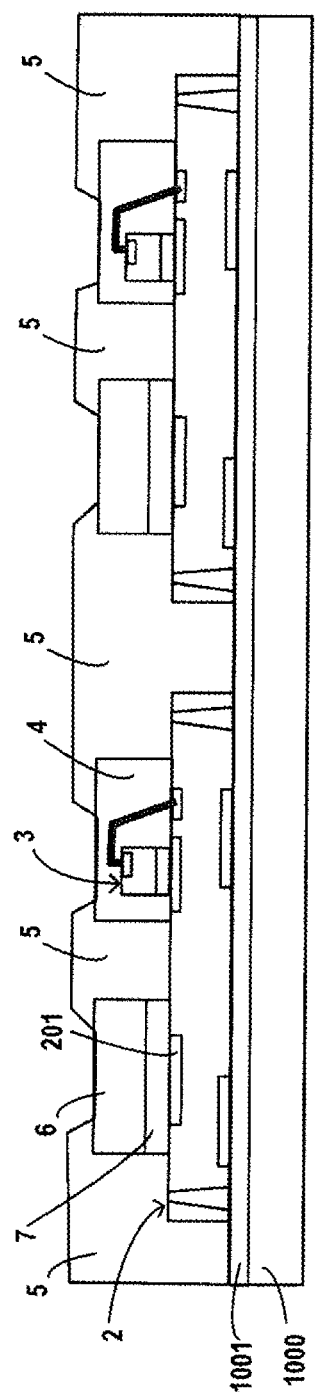

As shown in FIG. 3G, the transparent molding material 4 and the sensor region 201 are isolated utilizing the non-transparent molding material 5. As a result, the non-transparent molding material 5 isolates the light-emitting surface of the light-emitting device 3 from the sensor region 201 so as to prevent light radiated by the light-emitting device 3 from directly arriving at the sensor region 201 without being reflected by a nearby object.

The non-transparent molding material 5 partially covers the surface of the sensor chip 2 which has the sensor region 201, such that the sensor region 201 is not covered by the non-transparent molding material 5. In addition, the non-transparent molding material 5 also covers the side surfaces of the sensor chip 2. When the filtering component 6 is provided above the sensor region 201, the non-transparent molding material 5 can also cover a portion of the filtering component 6, such that a portion of the filtering component 6 which is located right above the sensor region 201 is not covered by the non-transparent molding material 5, in order that light reflected by the nearby object can arrive at the sensor region 201.

The non-transparent molding material 5 partially covers the transparent molding material 4, such that a light emergent path of the light-emitting device 3 is not covered by the non-transparent molding material 5. In particular, a portion of the transparent molding material 4 which is located right above the light-emitting surface of the light-emitting device 3 is not covered by the non-transparent molding material 5, in order that light emitted from the light-emitting device 3 can shine out.

As shown in FIG. 3H, a singulation means, such as saw blade 2000 is adopted to perform singulation processing to separate the individual packages. The singulation means may also include punching or cutting by a laser.

As shown in FIG. 3I, after the carrier 1000 and the adhesive 1001 are removed, the proximity sensor 200 as shown in FIG. 2 can be obtained.

As shown in FIG. 3J, solder balls 3000 can be attached at the conductive contacts 205 at the lower surface of the sensor chip 2 as desired for further connections to other circuits.

Figure 4:
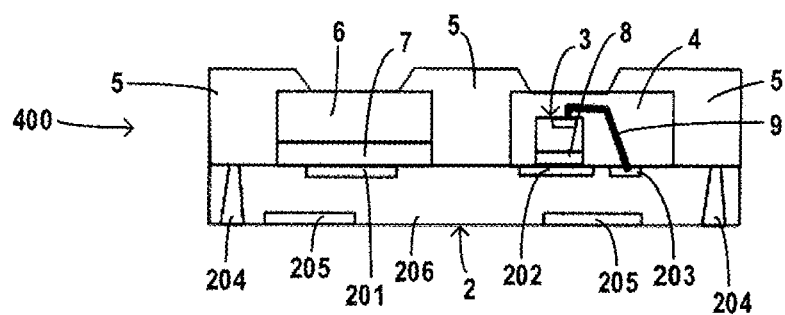
FIG. 4 shows a cross-section diagram of a proximity sensor according to another exemplary embodiment of the present disclosure.

FIG. 4 shows a cross-section diagram of a proximity sensor 400 according to another exemplary embodiment of the present disclosure. The difference between the proximity sensor 400 shown in FIG. 4 and the proximity sensor 200 shown in FIG. 2 is that the side surfaces of the sensor chip 2 in the proximity sensor 200 are covered by the non-transparent molding material 5, while the side surfaces of the sensor chip 2 in the proximity sensor 400 are not covered by the non-transparent molding material 5. The features shared by the proximity sensors 200 and 400 will not be described here again in the interest of brevity.

FIGS. 5A-5I are cross-section diagrams showing a process flow for manufacturing the proximity sensor 400 shown in FIG. 4. The manufacturing process for the proximity sensor 400 will be described in detail below in conjunction with FIGS. 5A-5I.

As shown in FIG. 5A, a sensor wafer is provided, wherein the sensor wafer comprises a plurality of sensor chips 2. In FIG. 5A, only two sensor chips 2 are shown as an example.

As shown in FIG. 5B, a carrier 1000 is provided, wherein an adhesive 1001 for fixing the sensor chip 2 is provided on an upper surface of the carrier 1000.

As shown in FIG. 5C, a wafer comprising a plurality of sensor chips 2 is fixed in its entirety on the carrier 1000 by means of the adhesive 1001.

As shown in FIG. 5D, light-emitting devices 3 are respectively provided on the various sensor chips 2 and the light-emitting devices 3 are electrically coupled to the sensor chips 2.

As shown in FIG. 5E, the transparent molding material 4 is used to at least cover a light-emitting surface of the light-emitting device 3. As an example, the light-emitting device 3 can be sealed by the transparent molding material 4. As shown in FIG. 3E, the transparent molding material 4 completely wraps the light-emitting device 3 and the conductive wire 9 for electrically coupling the light-emitting device 3 to the sensor chip 2.

As shown in FIG. 5F, a filtering component 6 is provided right above the sensor region. For example, the filtering component 6 can be adhered to the sensor chip 2 by means of a transparent adhesive 7.

As shown in FIG. 5G, the transparent molding material 4 and the sensor region 201 are isolated utilizing the non-transparent molding material 5. As a result, the non-transparent molding material 5 isolates the light-emitting surface of the light-emitting device 3 from the sensor region 201 so as to prevent light radiated by the light-emitting device 3 from directly arriving at the sensor region 201 without being reflected by a nearby object.

Figure 5H:
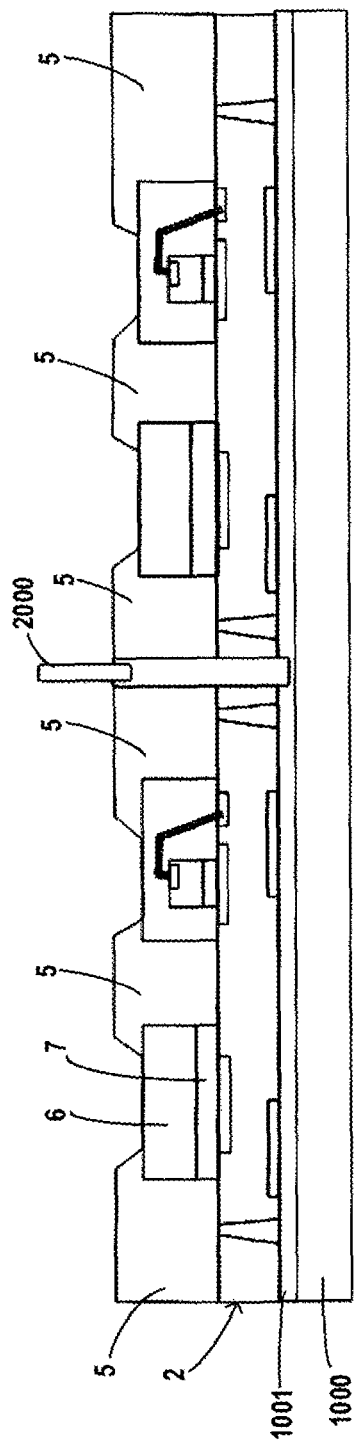

As shown in FIG. 5H, a singulation means 2000 is adopted to perform singulation processing.

Figure 5I:
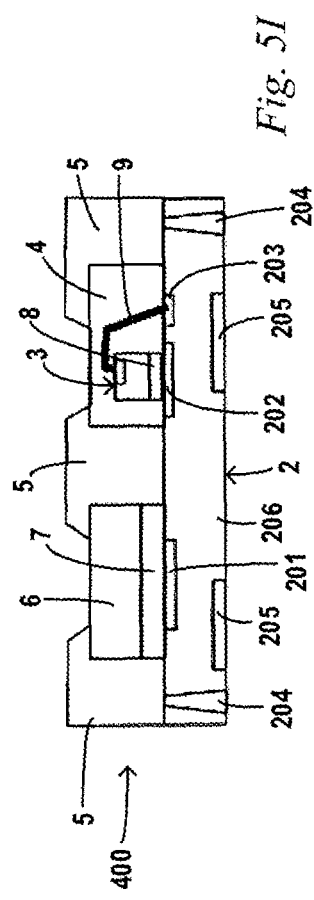

As shown in FIG. 5I, after the carrier 1000 and the adhesive 1001 are removed, an individual proximity sensor 400 as shown in FIG. 4 is obtained.

As compared to the proximity sensor 200 shown in FIG. 2, since the side surfaces of the sensor chip 2 in the proximity sensor 400 are not covered by the non-transparent molding material 5, the size of the proximity sensor 400 will become smaller.

Figure 6:
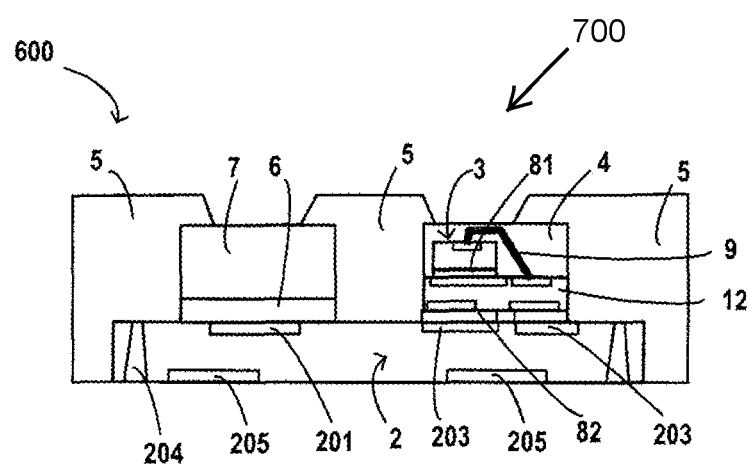
FIG. 6 shows a cross-section diagram of a proximity sensor according to a further exemplary embodiment of the present disclosure.

FIG. 6 shows a cross-section diagram of a proximity sensor 600 according to a further exemplary embodiment of the present disclosure. The difference between the proximity sensor 600 shown in FIG. 6 and the proximity sensor 200 shown in FIG. 2 is that a light-emitting assembly 700 located on an upper surface of a sensor chip 2 replaces the light-emitting device 3 and the transparent molding material 4 shown in FIG. 2. The light-emitting assembly 700 is an assembly package that includes the light-emitting device 3 and the transparent molding material 4 as will be explained in more detail below in reference to FIG. 7. The features shared by the proximity sensors 600 and 200 will not be described here again in the interest of brevity.

Figure 7:
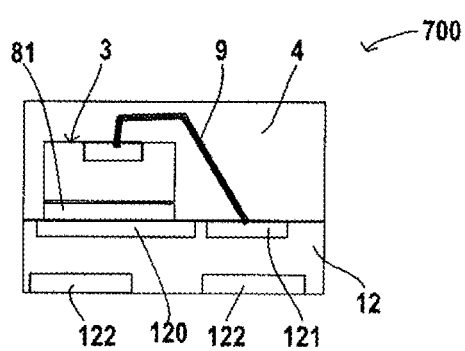
FIG. 7 is an enlarged schematic diagram of a light-emitting assembly in the proximity sensor shown in FIG. 6.

FIG. 7 is an enlarged schematic diagram of the light-emitting assembly 700 in the proximity sensor 600 shown in FIG. 6. As shown in FIG. 7, the light-emitting assembly 700 may comprise a substrate 12, a light-emitting device 3 located on the substrate 12 and electrically coupled to the substrate 12, and a transparent molding material 4 at least covering a light-emitting surface of the light-emitting device 3 (i.e., an upper surface thereof). The substrate 12 comprises a conductive contact 121 located at an upper surface thereof and an attachment region 120 for the attachment of the light-emitting device 3 as well as conductive contacts 122 provided at a lower surface thereof. The light-emitting device 3 can be attached to the attachment region 120 by means of a conductive attachment material 81. The light-emitting device 3 can also be electrically coupled to the conductive contact 121 via a conductive wire 9. As shown in FIGS. 6 and 7, the conductive contacts 122 provided at the lower surface of the substrate 12 can be attached to conductive contacts 203 on the sensor chip 2 by means of conductive attachment materials 82.

The light-emitting assembly 700 mentioned above can be manufactured beforehand in large quantities by means of a wafer level process and can therefore further improve productivity.

Figure 8:
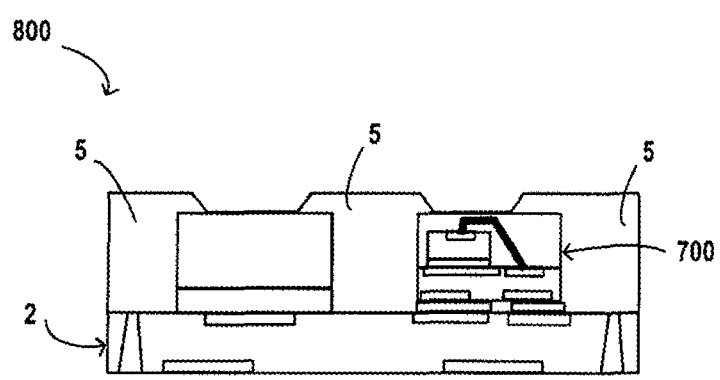
FIG. 8 shows a cross-section diagram of a proximity sensor according to a further exemplary embodiment of the present disclosure.

FIG. 8 shows a cross-section diagram of a proximity sensor 800 according to a further exemplary embodiment of the present disclosure. The difference between the proximity sensor 800 shown in FIG. 8 and the proximity sensor 600 shown in FIG. 6 is that the side surfaces of the sensor chip 2 in the proximity sensor 600 are covered by the non-transparent molding material 5, while the side surfaces of the sensor chip 2 in the proximity sensor 800 are not covered by the non-transparent molding material 5. The features shared by the proximity sensors 600 and 800 will not be described here again in the interest of brevity.

The proximity sensors 600 and 800 in FIGS. 6 and 8 can be manufactured by means of the following process. The process comprises: providing the sensor chip 2, the sensor chip 2 comprising a sensor region 201; providing the light-emitting assembly 700 on the sensor chip 2, the light-emitting assembly 700 comprising the substrate 12, the light-emitting device 3 located on the substrate 12 and electrically coupled to the substrate 12, and the transparent molding material 4 at least covering a light-emitting surface of the light-emitting device 3; and isolating the light-emitting assembly from the sensor region 201 using a non-transparent molding material 5.

In addition, the proximity sensors 200, 400, 600 and 800 shown in FIGS. 2, 4, 6 and 8 can be applied to a variety of electronic apparatuses. For example, the proximity sensors 200, 400, 600 and 800 can be electrically coupled to other circuits in an electronic apparatus by means of the conductive contacts 205 provided at the lower surface of the sensor chip 2.

Figure 9:
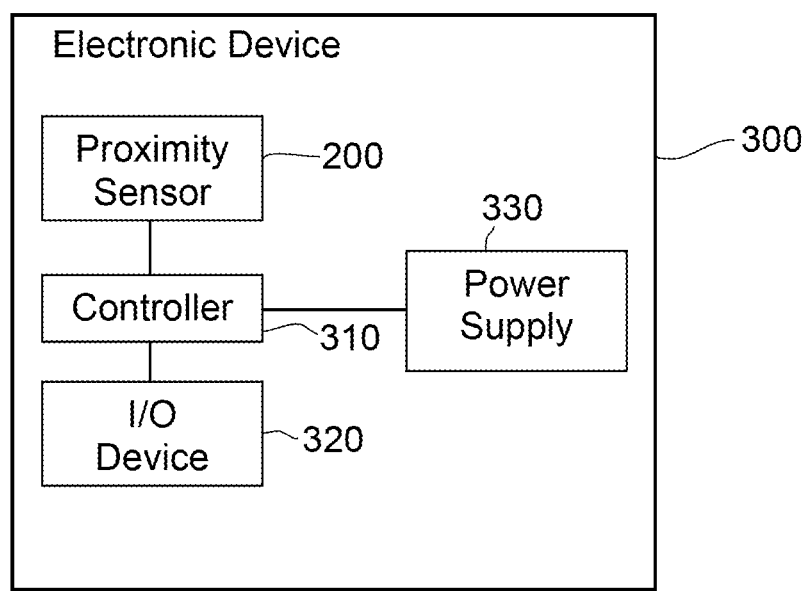
FIG. 9 is a block diagram of an electronic device according to one embodiment of the present disclosure.

FIG. 9 illustrates a block diagram of an electronic device that includes a proximity sensor, such as any one of the proximity sensors 200, 400, 600 and 800 shown in FIGS. 2, 4, 6 and 8. The electronic device may be a mobile communications apparatus, such as a mobile phone and a personal digital assistant, a laptop, a desktop computer, a camera or video device including a network video, a vehicle parking sensor, a wearable device, such as a smartwatch, or any other electronic device. The electronic device 300 includes a controller 310 and a proximity sensor 200 that is electrically coupled to the controller. The controller 310 includes control circuitry, which may include one or more processors, memory, and discrete logic. The controller 310 is configured to transmit signal to and receive signals from the proximity sensor 200. The electronic device may further include an input/output device 320, for example, a keyboard or a display that is coupled to the controller. The electronic device may further include a power supply 330, which may be a battery or components for coupling to an external power source.

In the various exemplary embodiments of the present disclosure, by providing the light-emitting device 3 on the sensor chip 2 and adopting the non-transparent molding material 5 to isolate the light-emitting device 3 from the sensor region 201, as compared to the proximity sensor 100 shown in FIG. 1, the use of the cap 11 is avoided, which is capable of reducing the manufacturing costs of the proximity sensors 200, 400, 600 and 800 and is capable of improving the productivity. In addition, as compared to the proximity sensor 100 shown in FIG. 1, since no substrate 1 is needed to support the sensor chip 2, it is possible to reduce the overall sizes of the proximity sensors 200, 400, 600 and 800.

Benefiting from the teaching of the above description and accompanying drawings, those skilled in the art could think of many modifications to the present disclosure and other embodiments. Therefore, it should be understood that the present disclosure is not merely limited to the disclosed specific embodiments, and modifications and embodiments are all intended to be encompassed within the scope of the appended claims.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A proximity sensor, comprising:
    a sensor chip including a sensor region;
    a light-emitting device located on the sensor chip and electrically coupled to the sensor chip, the light-emitting device including a light-emitting surface;
    a transparent molding material covering the light-emitting surface of the light-emitting device; and
    a non-transparent molding material isolating the transparent molding material from the sensor region of the sensor chip.

2. The proximity sensor as claimed in claim 1, wherein the light-emitting device is sealed by the transparent molding material.

3. The proximity sensor as claimed in claim 1, further comprising a conductive attachment material, wherein the light-emitting device is secured to the sensor chip by the conductive attachment material.

4. The proximity sensor as claimed in claim 1, further comprising a filtering component covering the sensor region of the sensor chip.

5. The proximity sensor as claimed in claim 4, further comprising a transparent adhesive, wherein the filtering component is coupled to the sensor chip by the transparent adhesive.

6. The proximity sensor as claimed in claim 1, wherein the non-transparent molding material covers a portion of the sensor chip, wherein the sensor region is not covered by the non-transparent molding material.

7. The proximity sensor as claimed in claim 1, wherein the non-transparent molding material covers a portion of the transparent molding material, wherein a light emergent path of the light-emitting device is not covered by the non-transparent molding material.

8. The proximity sensor as claimed in claim 1, wherein the sensor chip comprises through-silicon vias.

9. A proximity sensor, comprising:
a sensor chip including a sensor region;
a light-emitting assembly located on the sensor chip, the light-emitting assembly including:
a substrate,
a light-emitting device located on the substrate and electrically coupled to the substrate, and
a transparent molding material covering a light-emitting surface of the light-emitting device, wherein the substrate is electrically coupled to the sensor chip; and
a non-transparent molding material isolating the light-emitting assembly from the sensor region.

10. The proximity sensory as claimed in claim 9, wherein the non-transparent molding material is located on a surface of the sensor chip between the sensor region and the light-emitting assembly.

11. The proximity sensory as claimed in claim 9, further comprising transparent molding material covering the sensor region of the sensor chip.

12. An electronic apparatus, comprising:
a proximity sensor including:
a sensor chip including a sensor region, the sensor region located on a first surface of the sensor chip,
a light-emitting device located on the sensor chip and electrically coupled to the sensor chip,
a transparent molding material covering a portion of the light-emitting device and the sensor region of the sensor chip, and
a non-transparent molding material located on the first surface of the sensor chip between the transparent molding material covering the light-emitting device and the sensor region of the sensor chip; and
a controller coupled to the proximity sensor.

13. The electronic apparatus as claimed in claim 12, wherein the non-transparent molding material covers the first surface of the sensor chip.

14. The electronic apparatus as claimed in claim 12, wherein the non-transparent molding material covers side surfaces of the sensor chip.

15. A method for manufacturing a proximity sensor, comprising:

placing a light-emitting device on a first portion of a surface of a sensor chip, a second portion of the surface of the sensor chip including a sensor region;
electrically coupling the light-emitting device to the sensor chip;
covering a light-emitting surface of the light-emitting device with a transparent molding material; and
isolating the transparent molding material from the sensor region by forming a non-transparent molding material on the surface of the sensor chip between the first and second portions.

16. The method as claimed in claim 15, wherein prior to placing the light-emitting device on the first portion of the sensor chip, the method comprises placing the sensor chip on a carrier;
the method further comprising:
after isolating the transparent molding material from the sensor region, removing the carrier.

17. The method as claimed in claim 15, wherein covering the light-emitting surface of the light-emitting device with the transparent molding material comprises:
sealing the light-emitting device with the transparent molding material.

18. The method as claimed in claim 15, wherein electrically coupling the light-emitting device to the sensor chip comprises:
attaching the light-emitting device to the sensor chip using a conductive attachment material.

19. The method as claimed in claim 15, further comprising:
after covering the light-emitting surface of the light-emitting device with the transparent molding material, and before isolating the transparent molding material from the sensor region by forming the non-transparent molding material, placing a filtering component above the sensor region.

20. The method as claimed in claim 19, wherein placing the filtering component above the sensor region comprises:
adhering the filtering component to the sensor chip by a transparent adhesive.

21. The method as claimed in claim 15, wherein isolating the transparent molding material from the sensor region by forming the non-transparent molding material further comprises:
partially covering the first portion of the surface of the sensor chip with the non-transparent molding material, such that the second portion of the surface of the sensor chip is not covered by the non-transparent molding material.

22. The method as claimed in claim 15, wherein isolating the transparent molding material from the sensor region by forming a non-transparent molding material further comprises:
partially covering the transparent molding material with the non-transparent molding material, wherein a light emergent path of the light-emitting device is not covered by the non-transparent molding material.

23. The method as claimed in claim 15, wherein the sensor chip comprises through-silicon vias.

24. The method as claimed in claim 15, further comprising:
after isolating the transparent molding material from the sensor region with the non-transparent molding material, performing singulation processing.

25. A method for manufacturing a proximity sensor, comprising:

coupling a light-emitting assembly to a first portion of a surface of a sensor chip, a second portion of the surface of the sensor chip including a sensor region that remains exposed, the light-emitting assembly including:
a substrate,
a light-emitting device located on the substrate and electrically coupled to the substrate, and
a transparent molding material at least covering a light-emitting surface of the light-emitting device; and
forming a non-transparent molding material on the sensor chip between the first and second portions thereby isolating the light-emitting assembly from the sensor region.

26. The method as claimed in claim 25, further comprising coupling a transparent molding material to the sensor region of the sensor chip using an adhesive material.

\* \* \* \* \*

UNITED STATES PATENT AND TRADEMARK OFFICE
CERTIFICATE OF CORRECTION

| | | |
|---|---|---|
| PATENT NO. | : 10,126,462 B2 | Page 1 of 1 |
| APPLICATION NO. | : 14/982518 | |
| DATED | : November 13, 2018 | |
| INVENTOR(S) | : Jing-En Luan | |

It is certified that error appears in the above-identified patent and that said Letters Patent is hereby corrected as shown below:

In the Claims

Column 11, Line 39, Claim 10:
"The proximity sensory" should read --The proximity sensor--

Column 11, Line 43, Claim 11:
"The proximity sensory" should read --The proximity sensor--

Signed and Sealed this
Eleventh Day of June, 2019

Andrei Iancu
*Director of the United States Patent and Trademark Office*